United States Patent [19]
Murdock et al.

[11] Patent Number: 5,983,010
[45] Date of Patent: Nov. 9, 1999

[54] METHOD OF DESCRIBING A BUILDING STRUCTURE

[75] Inventors: Jeffrey Earl Murdock, 26-1656 Adanac Street, Vancouver, British Columbia, Canada, V5L 2C6; Peter James Moffat, 1737 30th Street, Vancouver, British Columbia, Canada, V7V 4P1

[73] Assignees: Jeffrey Earl Murdock; Peter James Moffat, both of Canada

[21] Appl. No.: 08/863,694

[22] Filed: May 27, 1997

Related U.S. Application Data

[63] Continuation-in-part of application No. 08/590,910, Jan. 24, 1996, abandoned.

[51] Int. Cl.⁶ .................................................. G06F 17/50
[52] U.S. Cl. ............................ 395/500.27; 395/500.01
[58] Field of Search ............................ 364/512, 578; 395/500.26, 500.27, 500.28

[56] References Cited

U.S. PATENT DOCUMENTS

| | | | |
|---|---|---|---|
| 3,927,948 | 12/1975 | Cox et al. | 356/167 |
| 4,275,449 | 6/1981 | Aish | 364/512 |
| 4,700,318 | 10/1987 | Ockman | 364/518 |
| 4,757,461 | 7/1988 | Stohr et al. | 364/518 |
| 4,855,939 | 8/1989 | Fitzgerald, Jr. et al. | 364/522 |
| 4,858,146 | 8/1989 | Shebini | 364/512 |
| 4,868,766 | 9/1989 | Oosterholt | 364/522 |
| 4,885,694 | 12/1989 | Pray et al. | 364/464.01 |
| 4,928,233 | 5/1990 | Millis | 364/522 |
| 5,122,971 | 6/1992 | Kamejima et al. | 364/512 |
| 5,165,015 | 11/1992 | Coggins | 395/155 |
| 5,465,221 | 11/1995 | Merat et al. | 364/552 |
| 5,555,406 | 9/1996 | Nozawa | 395/500 |
| 5,557,537 | 9/1996 | Normann et al. | 364/512 |
| 5,625,575 | 4/1997 | Goyal et al. | 364/578 |
| 5,668,736 | 9/1997 | Douglas et al. | 364/512 |
| 5,689,435 | 11/1997 | Umney et al. | 364/512 |
| 5,757,675 | 5/1998 | O'Brien, Jr. | 364/564 |
| 5,758,331 | 5/1998 | Johnson | 705/412 |
| 5,761,674 | 6/1998 | Ito | 707/104 |

*Primary Examiner*—Kevin J. Teska
*Assistant Examiner*—Lonnie A. Knox
*Attorney, Agent, or Firm*—Hall, Priddy & Myers

[57] ABSTRACT

A method of describing the structure of a building which includes first selecting a core structural information template, determining the orientation of the core structure, determining dimensions for the core, and reviewing and adjusting default dimensions for the core. Second, addition structural information templates are selected if the building has a composite structure, with the additional structures being additions to the core or to other additions. Third, for each addition, the orientation of the structure is determined, dimensions are determined, default dimensions are reviewed and adjusted, and the position of attachment to the core or to other additions is determined. Finally, the predefined core and addition structural information templates are used to process the collected information from the foregoing steps for the purpose of calculating areas of surfaces and volumes of spaces.

9 Claims, 15 Drawing Sheets

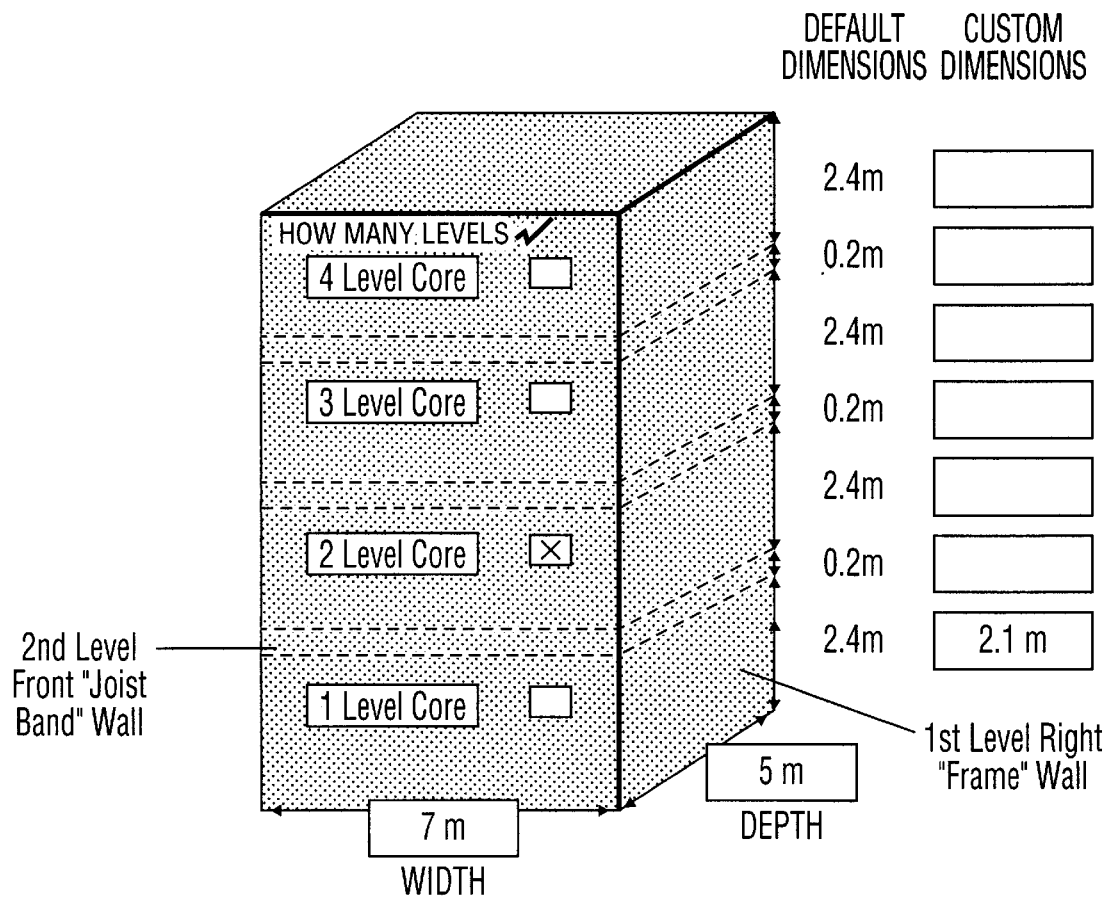
FIG. 8

Describe Construction

CORE

Ceilings

| INTERIOR | STRUCTURAL | | EXTERIOR |
|---|---|---|---|
| | Framing | Insulation | |
| ☒ Drywall<br>☐ Wood Finish | ☐ 2x4<br>☒ 2x6<br>☐ 2x8<br>☐ 2x10 | ☐ None<br>☐ R8<br>☐ R12<br>☒ R20<br>☐ R28<br>☐ R40<br>☐ R50 | ☒ Attic/Gable<br>☐ Attic/Hip<br>☐ Cathedral<br>☐ Flat<br>☐ Scissor |

Main Frame Walls

| INTERIOR | STRUCTURAL | | EXTERIOR |
|---|---|---|---|
| ☒ Drywall<br>☐ Wood Finish | ☒ 2x4<br>☐ 2x6 | ☐ None<br>☐ R8<br>☒ R12<br>☐ R20 | ☐ Stucco<br>☒ Wood<br>☐ Metal/Vinyl<br>☐ Brick |

Main Joist Band Walls

| | STRUCTURAL | | EXTERIOR |
|---|---|---|---|
| | ☒ Single Header<br>☐ Doub. Header | ☐ None<br>☐ R8<br>☒ R12<br>☐ R20 | ☐ Stucco<br>☒ Wood<br>☐ Metal/Vinyl<br>☐ Brick |

Exposed Floors

| | STRUCTURAL | | EXTERIOR |
|---|---|---|---|
| ☐ Carpet<br>☐ Tile/Lino<br>☐ Wood Finish | ☐ 2x8<br>☐ 2x10 | ☐ None<br>☐ R8<br>☐ R12<br>☐ R20 | ☐ None<br>☐ Sheathing |

Basement FRAME Walls

| INTERIOR | STRUCTURAL | | EXTERIOR |
|---|---|---|---|
| | Framing | Insulation | |
| ☒ Sheathing<br>☐ Wood Finish<br>☐ None | ☒ 2x4<br>☐ 2x6 | ☐ None<br>☐ R8<br>☒ R12<br>☐ R20 | ☒ Stucco<br>☐ Wood<br>☐ Metal/Vinyl<br>☐ Brick |

Basement ABOVE Grade CONCRETE Foundation Walls

| INTERIOR | STRUCTURAL | | EXTERIOR |
|---|---|---|---|
| ☐ None<br>☒ Drywall<br>☐ Wood Finish<br>☐ 1.5" EPS<br>☐ 2.0" EPS<br>☐ 0.75" XTPS<br>☐ 1.5" XTPS<br>☐ 2.5" XTPS | ☐ NONE<br>☐ 2X3<br>☒ 2x4<br>☐ 2x6 | ☒ None<br>☐ R8<br>☐ R12<br>☐ R20 | ☒ None<br>☐ 1.5" EPS<br>☐ 2.0" EPS<br>☐ 0.75" XTPS<br>☐ 1.5" XTPS<br>☐ 2.5" XTPS |

Basement BELOW Grade CONCRETE Foundation Walls

| INTERIOR | STRUCTURAL | | EXTERIOR |
|---|---|---|---|
| ☐ None<br>☒ Drywall<br>☐ Wood Finish<br>☐ 1.5" EPS<br>☐ 2.0" EPS<br>☐ 0.75" XTPS<br>☐ 1.5" XTPS<br>☐ 2.5" XTPS | ☐ NONE<br>☐ 2X3<br>☒ 2x4<br>☐ 2x6 | ☒ None<br>☐ R8<br>☐ R12<br>☐ R20 | ☒ None<br>☐ 1.5" EPS<br>☐ 2.0" EPS<br>☐ 0.75" XTPS<br>☐ 1.5" XTPS<br>☐ 2.5" XTPS |

Basement or Slab-On-Grade Floors

| INTERIOR | STRUCTURAL | | EXTERIOR |
|---|---|---|---|
| ☐ None<br>☒ Carpet<br>☐ Tile/Lino<br>☐ Wood Finish | ☒ None<br>☐ 2x3<br>☐ 2x4 | ☒ None<br>☐ 1.5" EPS<br>☐ 1.5" XTPS | ☒ None<br>☐ 1.5" EPS<br>☐ 1.5" XTPS |

*EPS = Expanded Polystyrene (white polybead)  
**XTPS = Extruded Polystyrene (blue SM)

Paste WINDOWS

Measure and Number Typical Windows

Measure a Typical Window Size

|  | Width (m) | Height (m) |
|---|---|---|
| Front Wall | 1.8 | .9 |
| Back Wall | 1.8 | .9 |
| Left Wall | 1.0 | 1.0 |
| Right Wall |  |  |

How Many Typical Windows Make-Up the Total Window Area in Each Zone

|  | Basement | Main |
|---|---|---|
| Front Wall | 2.0 | 6.0 |
| Back Wall | 1.5 | 4.0 |
| Left Wall |  | 1.0 |
| Right Wall |  |  |

Describe Construction

| Type | % of Total | Frame Material | Glazing | Frame Style |
|---|---|---|---|---|
| 1 | 100 | [X] Wood<br>[ ] Vinyl<br>[ ] Metal<br>[ ] Metal, thrm brk | [ ] Single<br>[X] Single, Wood storm<br>[ ] Single, Metal Storm<br>[ ] Double, Narrow<br>[ ] Double, 12mm<br>[ ] Double, Low E<br>[ ] Double, Wood Storm<br>[ ] Double, Metal Storm<br>[ ] Triple<br>[ ] Triple, Low E | [ ] Picture<br>[ ] Hinged<br>[ ] Slider<br>[X] Mixed |
| 2 |  | [ ] Wood<br>[ ] Vinyl<br>[ ] Metal<br>[ ] Metal, thrm brk | [ ] Single<br>[ ] Single, Wood storm<br>[ ] Single, Metal Storm<br>[ ] Double, Narrow<br>[ ] Double, 12mm<br>[ ] Double, Low E<br>[ ] Double, Wood Storm<br>[ ] Double, Metal Storm<br>[ ] Triple<br>[ ] Triple, Low E | [ ] Picture<br>[ ] Hinged<br>[ ] Slider<br>[ ] Mixed |
| 3 |  | [ ] Wood<br>[ ] Vinyl<br>[ ] Metal<br>[ ] Metal, thrm. brk. | [ ] Single<br>[ ] Single, Wood Storm<br>[ ] Single, Metal Storm<br>[ ] Double, Narrow<br>[ ] Double, 12mm<br>[ ] Double, Low E<br>[ ] Double, Wood Storm<br>[ ] Double, Metal Storm<br>[ ] Triple<br>[ ] Triple, Low E | [ ] Picture<br>[ ] Hinged<br>[ ] Slider<br>[ ] Mixed |

Orient Front Window

- ( ) North
- ( ) North East
- ( ) East
- ( ) South East
- ( ) South
- ( ) South West
- (X) West
- ( ) North West

FIG. 14

Paste DOORS

| Type | Estimate Number of Standard Doors | Location | Heating Zone | Construction |
|------|-----------------------------------|----------|--------------|--------------|
| 1 | 1.0 | [x] Core<br>[ ] Addition 1<br>[ ] Addition 2<br>[ ] Addition 3<br>[ ] Addition 4<br>[ ] Addition 5<br>[ ] Addition 6<br>[ ] Addition 7<br>[ ] Addition 8 | [x] Basement<br>[ ] Main | [ ] Hollow Wood<br>[ ] Solid Wood<br>[ ] Metal w/o Thermal Break<br>[x] Metal w Thermal Break<br>[ ] Hollow Wood w Storm<br>[ ] Solid Wood w Storm<br>[ ] Metal w/o Thermal Break w Storm<br>[ ] Metal w Thermal Break w Storm |
| 2 | .7 | [x] Core<br>[ ] Addition 1<br>[ ] Addition 2<br>[ ] Addition 3<br>[ ] Addition 4<br>[ ] Addition 5<br>[ ] Addition 6<br>[ ] Addition 7<br>[ ] Addition 8 | [ ] Basement<br>[x] Main | [ ] Hollow Wood<br>[ ] Solid Wood<br>[ ] Metal w/o Thermal Break<br>[ ] Metal w Thermal Break<br>[ ] Hollow Wood w Storm<br>[x] Solid Wood w Storm<br>[ ] Metal w/o Thermal Break w Storm<br>[ ] Metal w Thermal Break w Storm |
| 3 |  | [ ] Core<br>[ ] Addition 1<br>[ ] Addition 2<br>[ ] Addition 3<br>[ ] Addition 4<br>[ ] Addition 5<br>[ ] Addition 6<br>[ ] Addition 7<br>[ ] Addition 8 | [ ] Basement<br>[ ] Main | [ ] Hollow Wood<br>[ ] Solid Wood<br>[ ] Metal w/o Thermal Break<br>[ ] Metal w Thermal Break<br>[ ] Hollow Wood w Storm<br>[ ] Solid Wood w Storm<br>[ ] Metal w/o Thermal Break w Storm<br>[ ] Metal w Thermal Break w Storm |

FIG. 15

Surface Areas And Volumes of Spaces Obtained by
Applying Method of This Invention to a Sample House

|  |  | Envelope Component Surface Area [ $m^2$ ] |
|---|---|---:|
| Ceilings | | |
| | attic ceiling | 100.5 |
| | Total | 100.5 |
| Main Level | | |
| | frame walls | 80.7 |
| | doors | 1.9 |
| | front wall windows | 11.7 |
| | back wall windows | 6.7 |
| | Total | 101.0 |
| Foundation Level | | |
| | joist band | 7.1 |
| | frame walls | 38.7 |
| | concrete walls above grade | 6.7 |
| | shallow basement walls | 12.2 |
| | full-depth basement walls | 12.2 |
| | doors | 1.9 |
| | front wall windows | 4.3 |
| | back wall windows | 3.7 |
| | Total | 86.8 |
| Floors | | |
| | exposed | 30.0 |
| | slab on grade | 7.7 |
| | shallow basement | 54.6 |
| | full-depth basement | 4.4 |
| | Total | 96.7 |

| | |
|---|---:|
| Total Envelope Surface Area [ $m^2$ ]: | 385.0 |
| Total Heated Volume [ $m^3$ ]: | 421.0 |

FIG. 16

METHOD OF DESCRIBING A BUILDING STRUCTURE

This application is a continuation-in-part of copending application Ser. No. 08/590,910 filed Jan. 24, 1996, and now abandoned.

FIELD

The present invention relates to a method of describing a building structure, which produces useful information concerning geometric form, orientations, dimensions, areas of surfaces, and volumes of spaces that enables further processes concerning the building to be carried out.

BACKGROUND

Before being able to do such things as an energy simulation to determine heat losses and gains of and through various components of a building structure, costing out construction, renovation work, or graphically representing a building using a computer-based application, (e.g. a CAD program), it is necessary to have information concerning the geometric form and orientation of the structure, dimensions of the structure, areas of individual building components (e.g. ceilings, walls, and floors), and volumes of spaces contained within the building structure.

Conventional methods of computing areas of surfaces and volumes of spaces involve performing numerous hand calculations that are prone to error, are tedious and time consuming to carryout, and are also very often done in an unsystematic and approximate manner. Some computer-based applications calculate areas of surfaces and volumes of spaces, but only if detailed structural data have been appropriately provided to the application. The preparation of detailed structural data for such applications often involves intermediate hand calculations.

Graphically representing a building structure using a computer-based application also requires the appropriate provision of detailed structural data to the application. The tasks of preparing an interdependent set of detailed structural data and entering the data into computer-based applications are expert skills and are also tedious and time consuming.

Before being able to graphically represent a building structure using a computer-based application and to calculate areas of surfaces and volumes of spaces, it is necessary to have a description of a building structure's geometric form, orientation, and dimensions. Conventional methods of collecting and recording this information involve hand-drawn building sketches (e.g. floor plans). Drawing building sketches by hand is prone to error, is tedious and time consuming, and is also very often done in an unsystematic and approximate manner.

To describe the building structure of a typical residential building when conducting a detailed energy audit that includes an energy simulation to determine heat losses and gains of and through various components of the structure, the conventional method involves hand-drawn building sketches, collecting dimensional and structural data from the building, calculating areas of surfaces and volumes of spaces, and can take up to 10 person hours for a single building. It is desirable to have an improved method that can considerably reduce this time and hence the associated cost.

Accordingly, it is an object of the present invention to provide an improved method of describing a building structure.

SUMMARY OF THE INVENTION

According to the invention, there is provided a method of describing the structure of a building, comprising: selecting a core structural information template; determining the orientation of the core structure; determining dimensions for the core; reviewing and adjusting default dimensions for the core; selecting one or more addition structural information templates if the building has a composite structure, with each additional structure being an addition to the core or to other additions; determining the orientation of each addition; determining dimensions for each addition; reviewing and adjusting default dimensions for each addition; and determining the position of attachment to the core or to other additions for each addition.

The method provides an efficient sequence of steps for describing the structure of a building so as to provide a usable set of structural information. The combined set of predefined core and addition structural information templates and the collected information from the foregoing steps is sufficient to allow for the automated calculation of the area of each discrete surface of the described structure and the volume of each discrete space contained in the structure. The set of predefined and collected information is also sufficient to allow for the graphic representation of the structure using a computer-based application.

The method requires the collection of a reduced set of information and provides a systematic procedure for collecting such data. Also, the set of structural information generated by the method establishes a basis for an efficient sequence of steps for collecting and processing related building information (e.g. construction details of building assemblies and locations of doors, windows, and the ground with respect to the building structure).

Advantageously, the method includes describing: the location of the ground relative to the building structure; construction details for the building structure; reference window dimensions for each side of the building structure, the number of such windows on each level of the building structure that provide an equivalent total window area for that level of the structure, the orientation of such windows, and their construction details; and the number of doors of standard size, the location of such doors, and their construction type.

The core structure may have rectangular geometry. Alternatively, any shape of core could be selected that is preferably consistent with the shape of the building.

The use of predefined core and addition structural information templates permits prelabelling of surfaces, vectors, and vertices, which allows users to quickly and easily assign attributes to individual and groupings of structural components. Prelabelling of core and addition structural information template components allows users to assign attributes to individual and groupings of components as they proceed with the task of describing the structure of a building (e.g. construction details of ceiling, wall, and floor assemblies). The suitability of the method's resulting information to computer processing offers the potential benefits of computer processing in efforts to collect and process other building information that is linked to or otherwise dependent on a description of building structure (e.g. locations of doors, windows, and the ground with respect to the building structure).

In another aspect of the invention, the method may use the calculated areas of surfaces and volumes of spaces in applying an energy audit that includes an energy simulation to determine heat losses and gains of and through various components of the building structure. Such method involves: determining the structure of a building's heated envelope, selecting a core structural information template, determining the orientation of the core structure, determining dimensions for the core, reviewing and adjusting default dimensions for the core, and describing construction details for the core. The method further involves: selecting one or more addition structural information templates if the building has a composite structure, with each additional structure being an addition to the core or to other additions; determining the orientation of each addition; determining dimensions for each addition; reviewing and adjusting default dimensions for each addition; determining the position of attachment to the core or to other additions for each addition; describing construction details for each addition; and describing the location of the ground with respect to the building structure. The method further involves: using predefined core and addition structural information templates to process the collected information from the foregoing steps for the purpose of calculating areas of surfaces and volumes of spaces; and applying such calculated areas and volumes and the set of predefined and collected information to an energy simulation program to determine heat losses and gains of and through various components of the building structure. The invention integrates the tasks of describing a building structure, of collecting construction details, and of describing the structure of the heated envelope of the building.

BRIEF DESCRIPTION OF THE DRAWINGS

The novel features believed characteristic of the invention are set forth in the appended claims. The invention itself, as well as other features and advantages thereof, can be best understood by reference to the following detailed description that should be read in conjunction with the accompanying drawings (sketches, diagrams, worksheets, and table), wherein:

FIG. 8 is a worksheet describing the two level box-shaped core structure of the house shown in FIG. 6;

FIG. 12 is a worksheet describing the construction details of the core structure for the house shown in FIG. 6;

FIG. 13 is a worksheet describing the construction details of the addition structure for the house shown in FIG. 6;

FIG. 14 is a worksheet estimating window areas, orienting the windows, and describing window construction details for the house shown in FIG. 6 (windows on levels 1 and 2 of the back wall are not shown in FIG. 6);

FIG. 15 is a worksheet estimating door areas and describing door construction details for the house shown in FIG. 6 (the door on level 2 of the back wall is not shown in FIG. 6);

FIG. 16 is a table listing a sample of areas of surfaces and volumes of spaces that can be obtained by applying the method of this invention to a building structure.

DETAILED DESCRIPTION WITH REFERENCE TO THE DRAWINGS

The first step in describing the structure of a building is to establish a core structure, which is of a geometry that is generally consistent with that of the building. For example, a box-shaped core structure is consistent with a box-shaped building that has a number of additions. Conversely, a circular core structure is consistent with a circular-shaped building. For the first-mentioned example, the size of the core would ordinarily be chosen to be the largest box-shaped structure that the building can accommodate. The core is defined by a structural information template that can include: a predefined geometric form; a predefined orientation for the geometric form with respect to the earth's gravitational force (i.e. down); and unique labels assigned to each discrete surface, vector, and vertices of the geometric form. Unique labels are also assigned to various groupings of surfaces, vectors, and vertices. Such information templates give a clear indication of all the orientations and dimensions that need to be specified to fully describe the geometric form. Finally, default values are provided for select dimensions. For example, the typical North American wall height of 8 feet for rooms in residential buildings is appropriate as the building wall height default value for each level of a residential building located in North America. A structural information template is essentially a form with a number of variables as exemplified by the worksheet shown in FIG. 8.

If the building has a composite structure, then the composite structure is developed by adding additions to the core or to the additions themselves. Additions can be of any size and shape, and can be located on the inside, outside, or on the inside and outside of the exterior surface of the structure to which they are to be added. Additions are defined, as is the core, by addition structural information templates. All of the items listed for a core structural information template in the paragraph immediately preceding are also applicable for addition structural information templates. Also, there are predefined constraints on the types of structures to which the addition can be added and on the location of the addition relative to the structure to which it is being added. There is a prescribed method for specifying the location of the addition relative to the structure to which it is being added.

Figure 1:
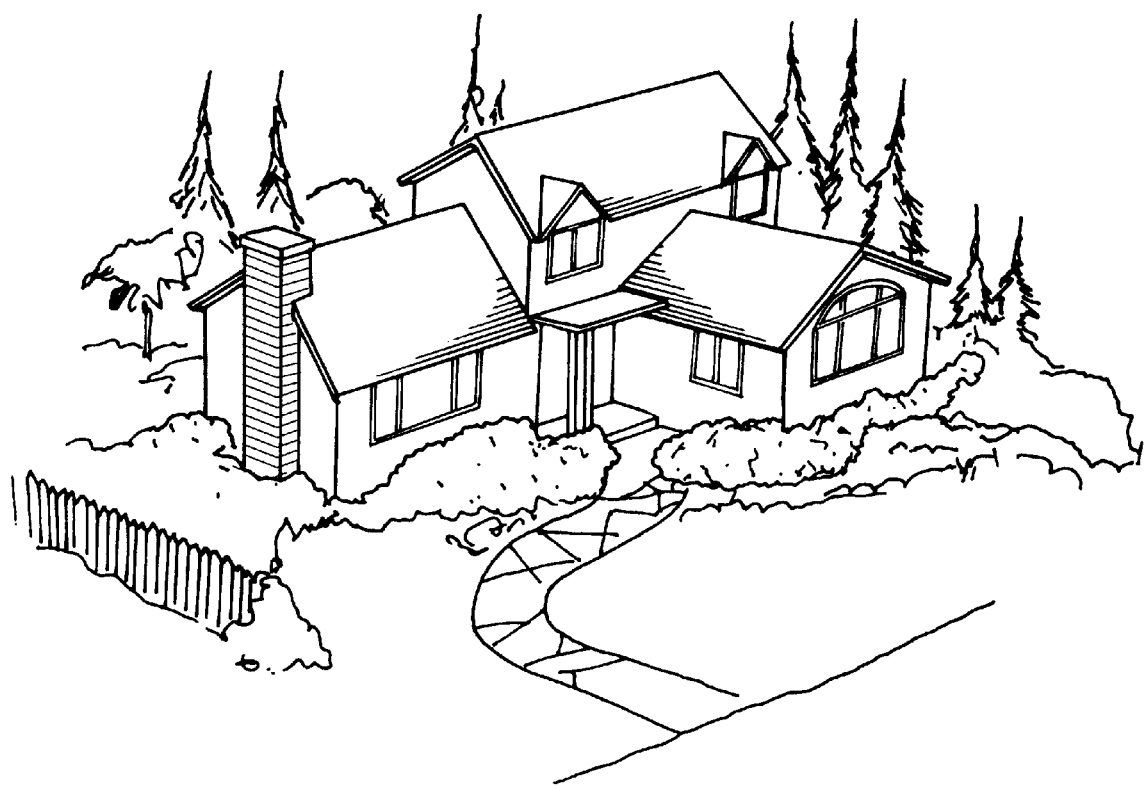
FIG. 1 is a sketch showing a sample house to which the method is applied.
Figure 2:
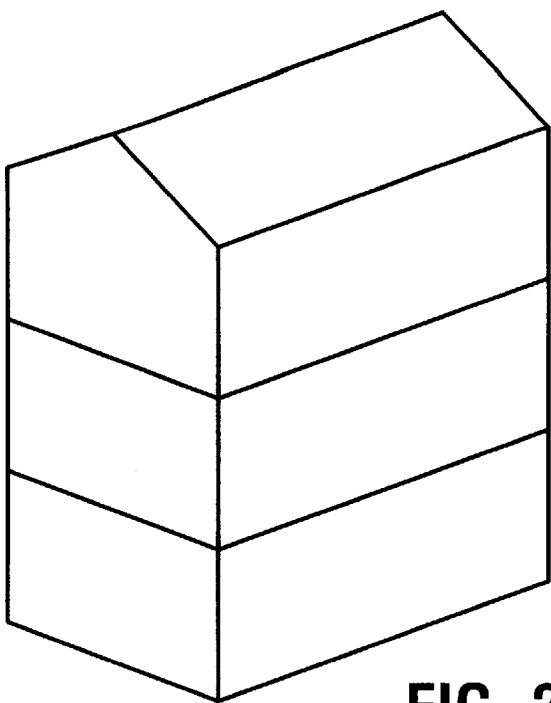
FIG. 2 is a sketch showing the core that is established for the house shown in FIG. 1.

To demonstrate in general terms how the present method is applied to describing the exterior surface of a house, consider the house shown in FIG. 1. The first step is to establish a core, which is shown in FIG. 2. To establish the core, the user must select a core structural information template and collect a minimal number of measurements from the house or from building plans of the house to determine dimensions such as width, depth, wall heights, and joist band heights.

Figure 3:
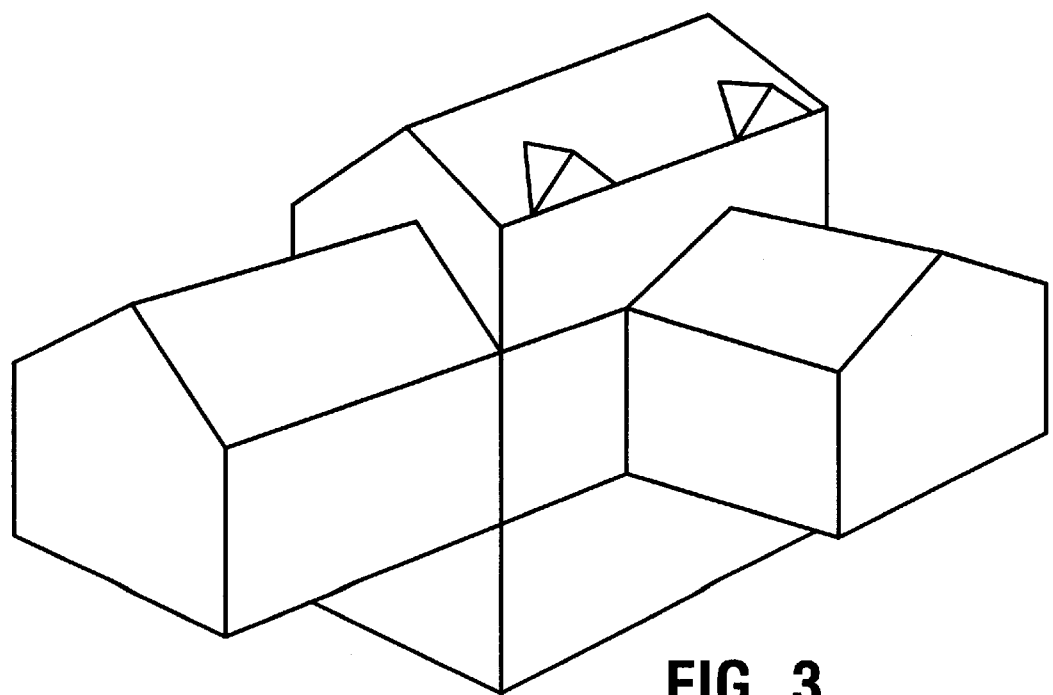
FIG. 3 is a sketch showing the four additions that are established from the core shown in FIG. 2.

The second major step is to establish the additions from the core, which are shown along with the core in FIG. 3. To establish an addition, the user must select an addition structural information template and collect a minimal number of measurements to determine dimensions such as width, depth, wall heights, and joist band heights. Also, the user must determine the location of the addition relative to the structure to which it is being added.

Figure 4:
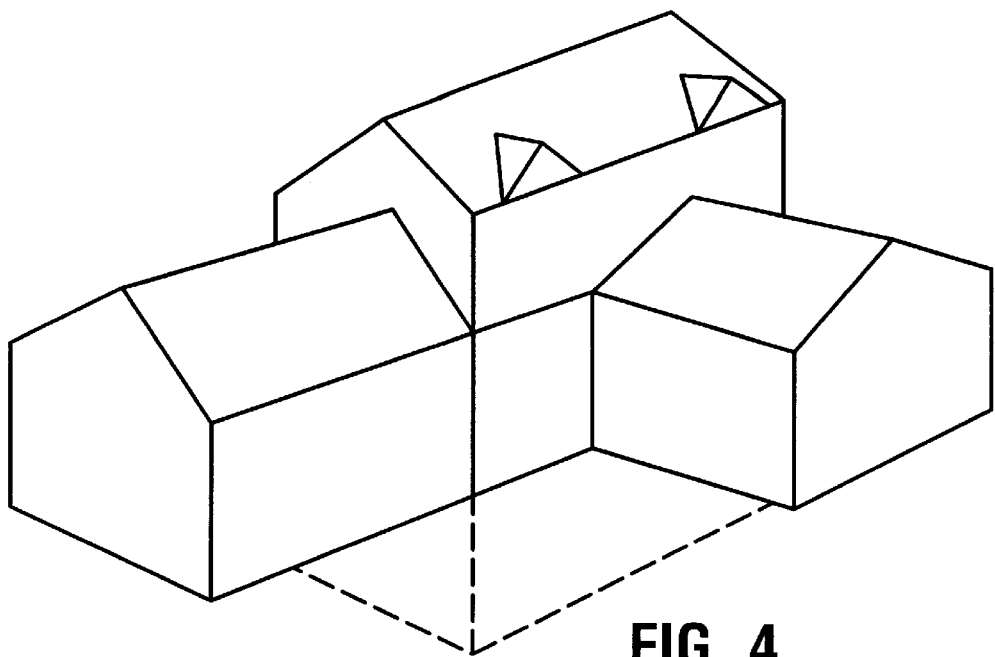
FIG. 4 is a sketch showing the location of the ground with respect to the composite structure shown in FIG. 3.

The third step, as shown in FIG. 4, is to describe the location of the ground with respect to the composite structure. An efficient procedure for this task is to describe the location of the ground for any core or addition that has exterior surfaces in contact with the ground. For each core and addition, the length of each such structure's floor perimeter that is at or above the ground is estimated, as is the average height of all walls that are below ground for each such structure. The slope of the landscaping surrounding each such structure is described (e.g. flat, gradual slope, or steep slope). If a core or addition has more than one type of above-ground wall construction (e.g. concrete foundation walls supporting framed pony walls), the average height of the concrete foundation walls that are exposed above ground for each such structure is estimated.

Figure 5:
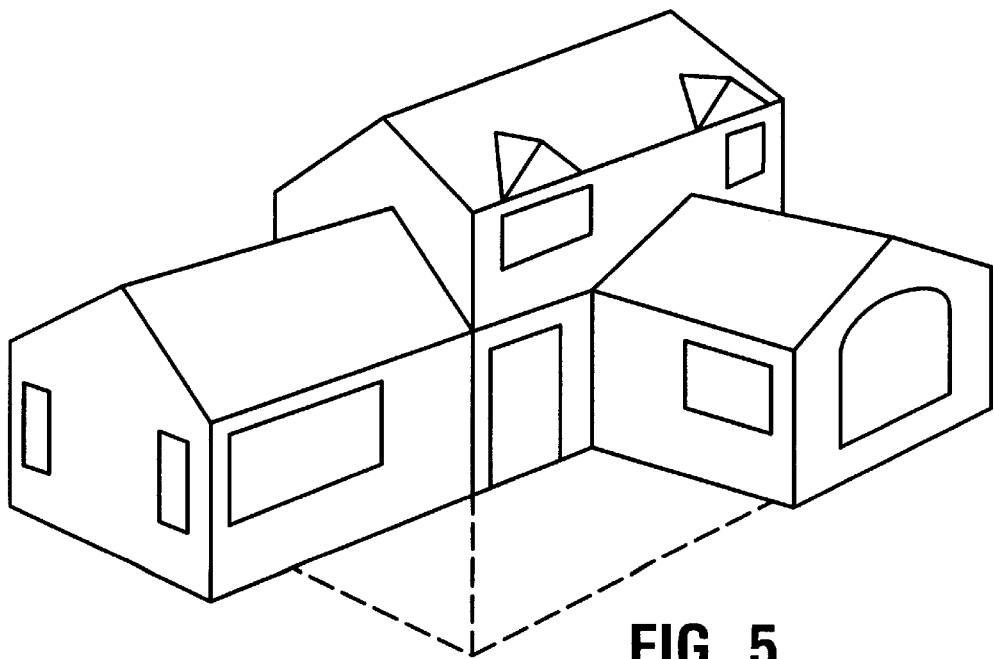
FIG. 5 is a sketch showing the pasting of windows and doors onto the composite structure shown in FIG. 4.

The fourth step as shown in FIG. 5 is to describe the dimensions of windows and doors and their location on the composite structure. An efficient procedure for this task is to record the dimensions of each window and door, and to identify a discrete structural surface location for each window and door using the pre-defined surface labels provided in the core and addition structural information templates. Windows can be placed in doors.

An alternate but less detailed procedure for accomplishing the fourth step is to first establish a reference window dimension for each of the front, back, left, and right sides of the composite structure and then to estimate the number of such windows on each level of the structure that provide an equivalent total window area for that level of the structure. As part of this alternate procedure, reference dimensions of a standard-sized door are preset (e.g. 2'8" wide by 6'8" high) and the number of such doors that provide an equivalent total door area for each level of each side of the structure is estimated. This alternate procedure facilitates a quick visual estimate of window and door areas for each level and side of the composite structure.

Figure 6:
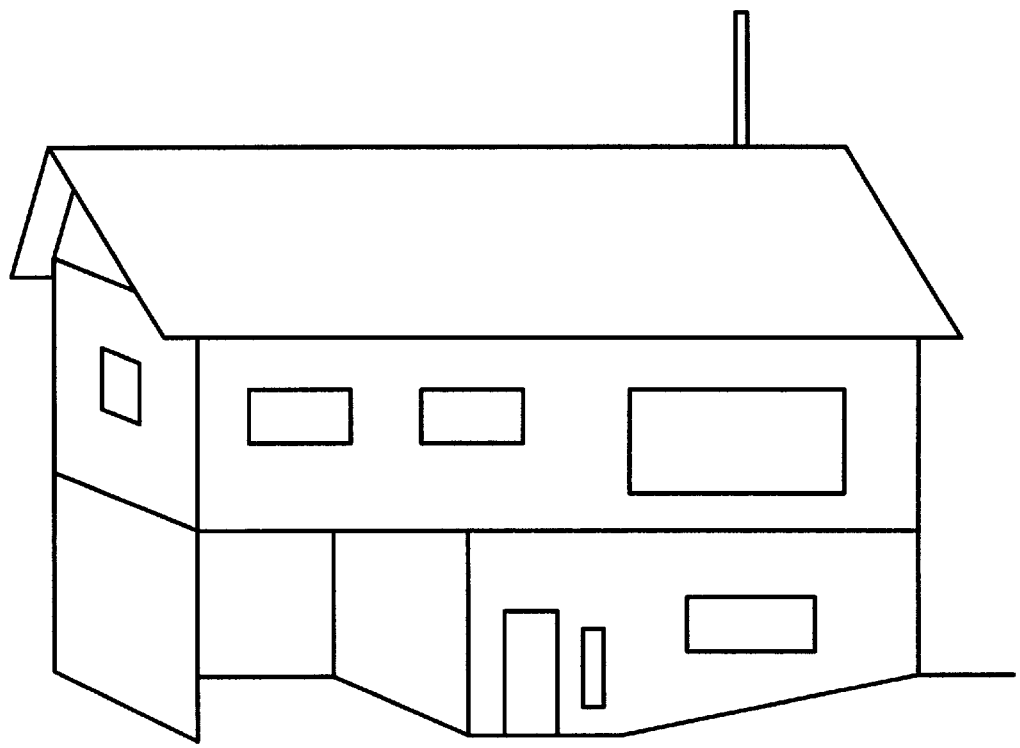
FIG. 6 is a sketch showing another house to which a detailed application of the method is applied.
Figure 7:
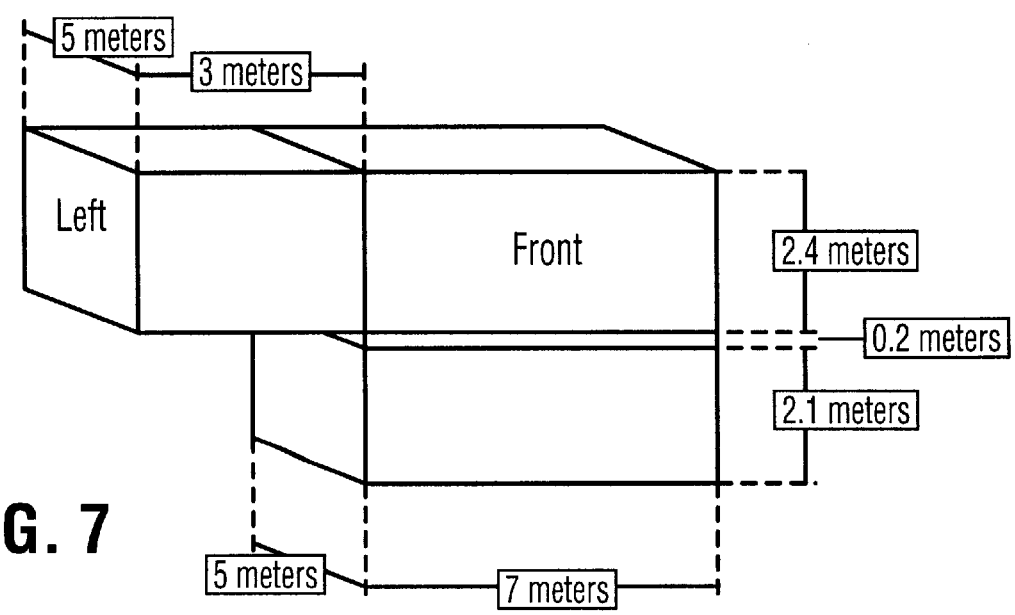
FIG. 7 is a sketch showing the appropriate level of detail required to describe the composite structure of the building's heated envelope shown in FIG. 6.

FIG. 6 shows a house to which a more detailed application of the present method is demonstrated. With energy simulation to determine heat losses and gains of and through various components of the building structure as the process to which the method of the invention is applied in this demonstration, the structure of interest is the building's heated envelope. The appropriate structure of the building's heated envelope excludes the unheated roof cavity and is shown in FIG. 7, together with measured width, depth, and height dimensions of the heated envelope.

Referring to FIG. 8, the worksheet provides for the selection of one of four related core structural information templates: one, two, three, and four level box-shape structures. The worksheet provides for the recording of structure orientation, width and depth dimensions, as well as the review and adjustment of default wall and joist band height dimensions for the core. The worksheet's illustration and layout are designed to show the relationship between a core structural information template's predefined organization of information and the collected data. In this case, the two-level core structural information template has been selected, the southeast orientation of the front wall has been recorded, a width of 7 meters and a depth of 5 meters have been recorded, and the default height of the first level walls has been reviewed and adjusted. As shown in FIG. 7, the height of the first level is 2.1 meters rather than the default of 2.4 meters. Thus, the value 2.1 is entered in the custom dimensions block.

Figure 9:
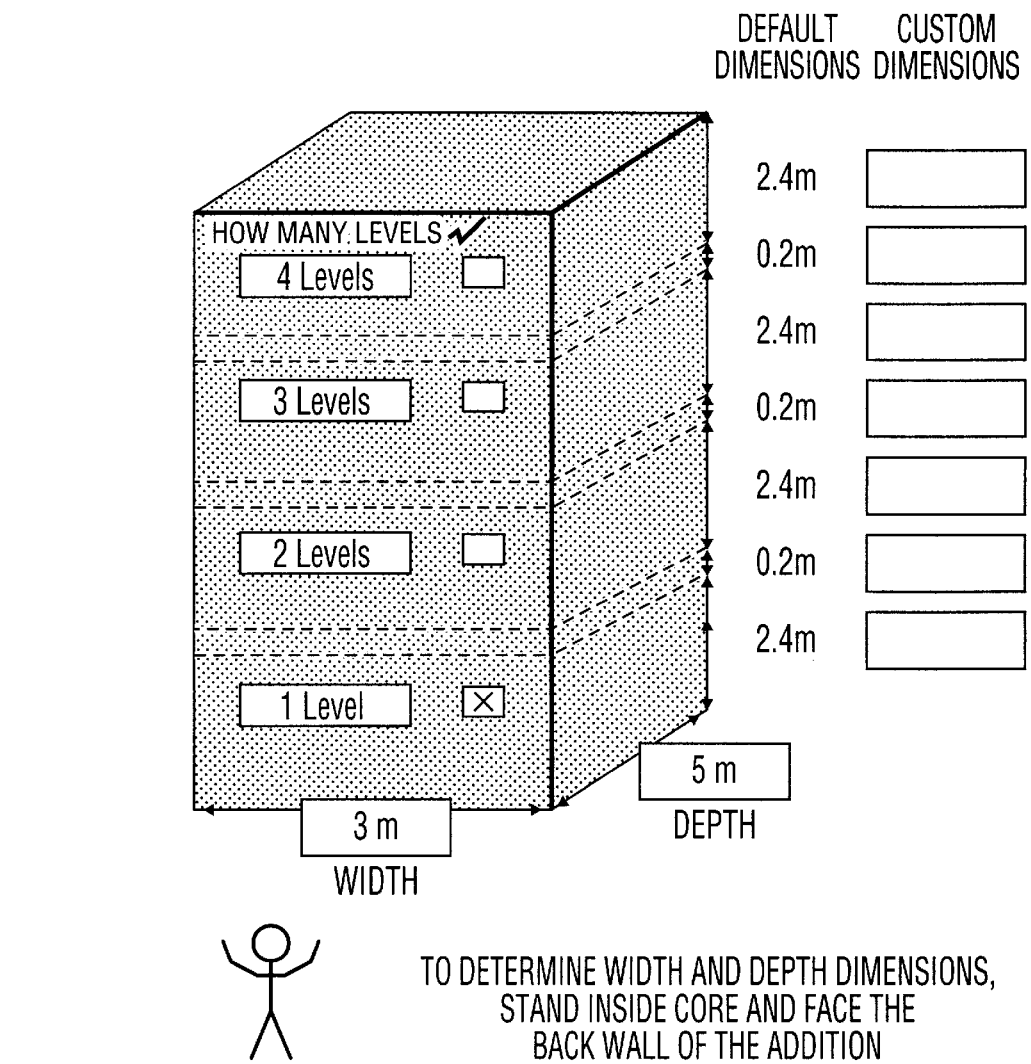
FIG. 9 is a worksheet describing the one level box-shaped addition structure of the house shown in FIG. 6.

Referring to FIG. 9, the worksheet provides for the selection of one of four related addition structural information templates: one, two, three, and four level box-shape structures. The worksheet provides for the recording of width and depth dimensions, as well as the review and adjustment of default wall and joist band height dimensions for the addition. The worksheet's illustration and layout are designed to show the relationship between an addition structural information template's predefined organization of information and the collected data. The addition in FIG. 7 is the portion of the house that is outside the core structure, and that has a width of 5 meters, a depth of 3 meters, and a wall height of 2.4 meters. In this case, the one-level addition structural information template has been selected and the width and depth have been recorded, with no adjustment of the default first level wall height that is provided. The worksheet also provides a means for indicating to what structure the addition is added, at what level, and to which side it is attached. Any step-up or step-down of the floor from the addition to the structure to which it is added is recorded. In this case, the addition is added to the left side of the second level of the core. No step-up or step-down of the floor is recorded, as the floor of the addition is even with the floor of the second level of the core. FIG. 8 also shows two sample surface label tags. These tags are indicative of one logical, generally understood labeling system. Each tag refers to a discrete surface.

Figure 10:
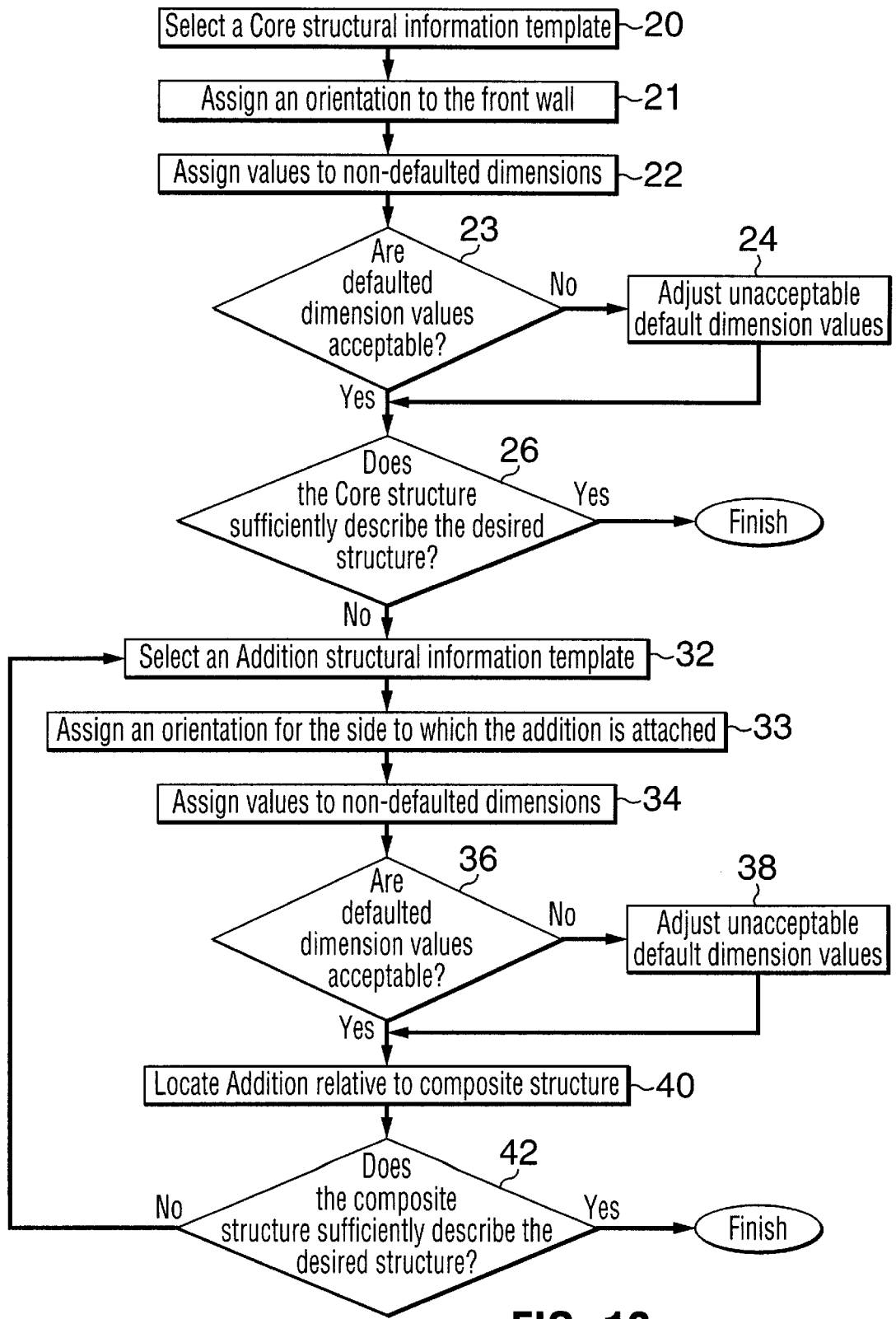
FIG. 10 is a flow diagram of the general sequence of steps in describing the structure of a building.

Referring to FIG. 10, the method is first to select a core structural information template at step 20, to assign an orientation to the front wall of the core at step 21, and to assign values to non-defaulted dimensions at step 22. Next, the default dimensions for the core are checked at step 23 to determine whether or not they are all acceptable. If not, then the unacceptable default dimensions are adjusted for the core. Next at step 26, a determination is made as to whether or not the core structure sufficiently describes the desired building structure. If it does, then the procedure is complete. If it does not, then an addition structural information template is selected at step 32, the orientation of the side to which the addition is attached is assigned at step 33, and non-defaulted dimensions for the addition are assigned values at step 34. At step 36, a determination is made as to whether or not the defaulted dimensions are acceptable for the addition. If not, then the unacceptable default dimensions for the addition are changed at step 38. At step 40, the addition is located relative to the structure to which it is being added. A determination is made at step 42 as to whether or not there are any other additions required to sufficiently describe the desired building structure. If no other additions are required, then the procedure is complete. If other additions are required, then the procedure returns to step 32 to add another addition.

Figure 11A:
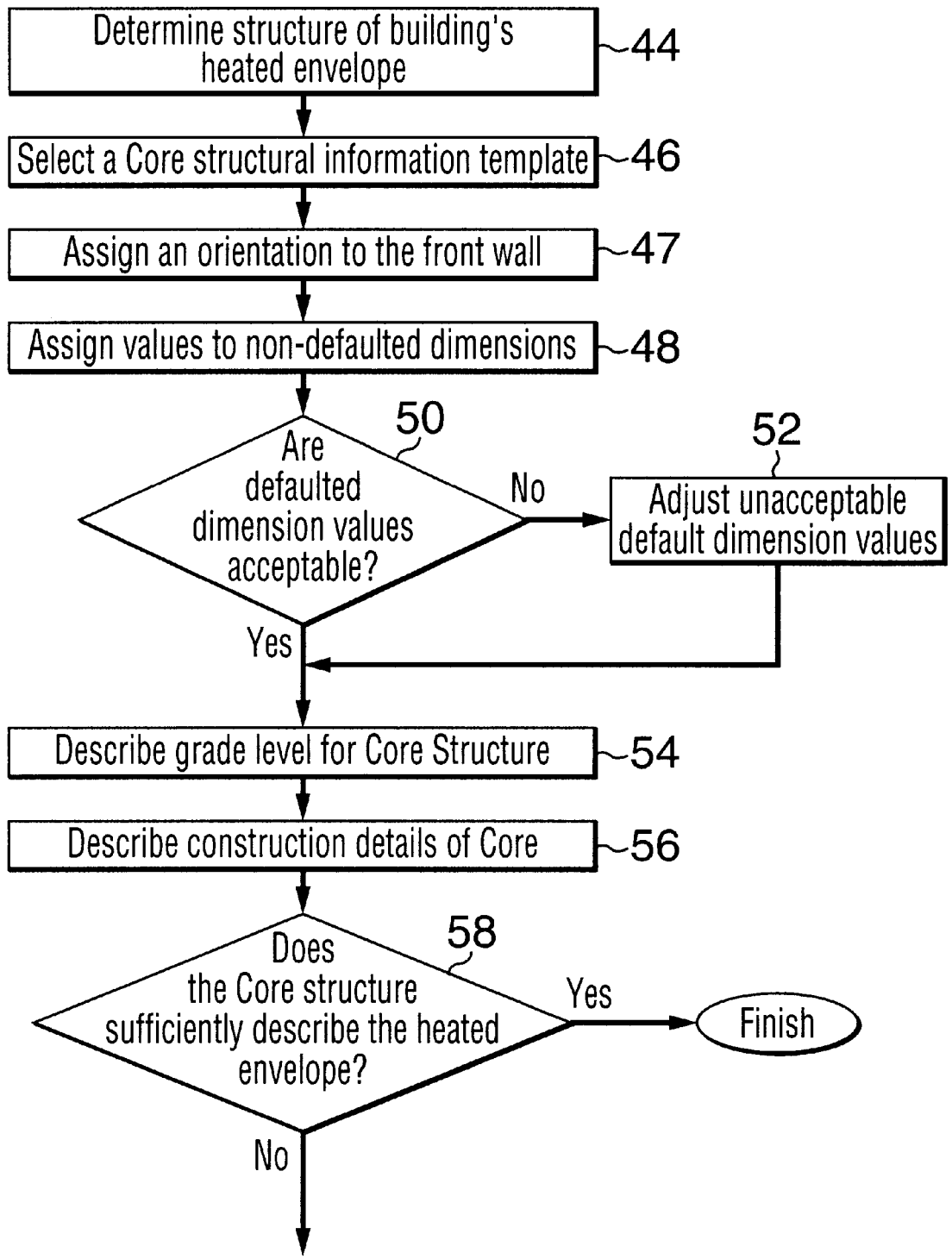
FIG. 11a, which is continued in FIG. 11b, is a flow diagram of a general method for collecting information regarding the heated envelope of a residential building with the purpose of performing an energy audit that includes an energy simulation to determine heat losses and gains of and through various components of the building structure.
Figure 11B:
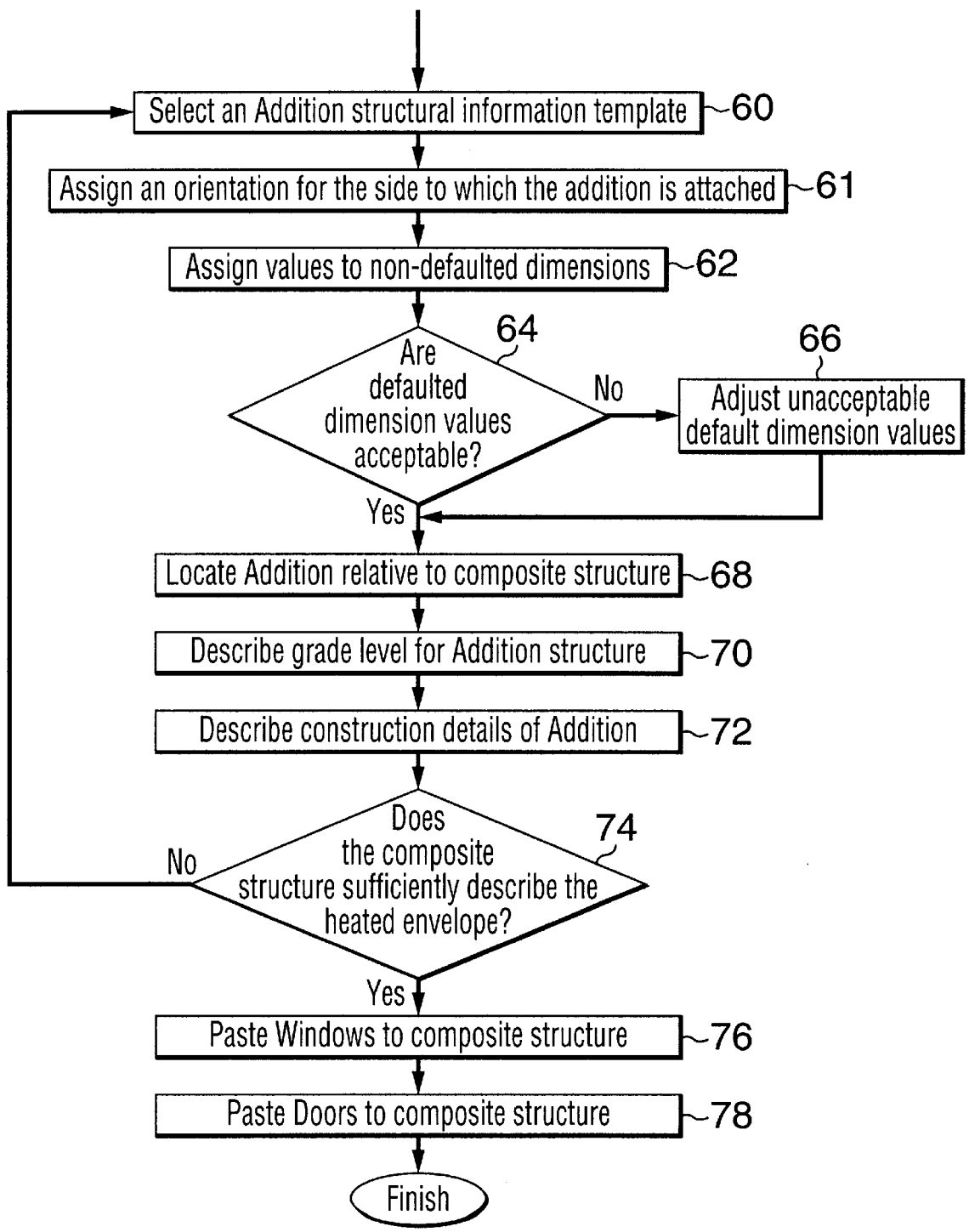

FIGS. 11a and 11b show a flow diagram directed to the specific task of performing an energy audit that includes an energy simulation to determine heat losses and gains of and through various components of the building structure. In this case, the energy audit is applied to the house of FIG. 6, the heated envelope of which is shown in FIG. 7. After determining the heated envelope at step 44, the core structural information template is selected at step 46, the orientation of the front wall of the core is assigned at step 47, and non-defaulted dimensions are assigned to the core at step 48. Defaulted dimensions for the core are changed if necessary at steps 50 and 52. The location of the ground with respect to the core is described for the core structure at step 54. Next at step 56, construction details of the core are described as shown in the worksheet of FIG. 12. Details such as wall covering, framing board size, insulation, roof construction, exterior finish, basement wall construction, main wall and joist band construction, and floor construction are all specified. At step 58, it is determined whether or not the core structure sufficiently describes the heated envelope. If so, then the procedure is complete. If not, then an addition structural information template is selected at step 60. The orientation of the side to which the addition is attached is assigned at step 61. Values are assigned to non-defaulted dimensions for the addition at step 62. A test is made at step 64 as to whether or not the defaulted dimensions are acceptable for the addition. Any changes in the default dimensions for the addition are made at step 66. At step 68, the addition is located relative to the composite structure.

Figure 13:
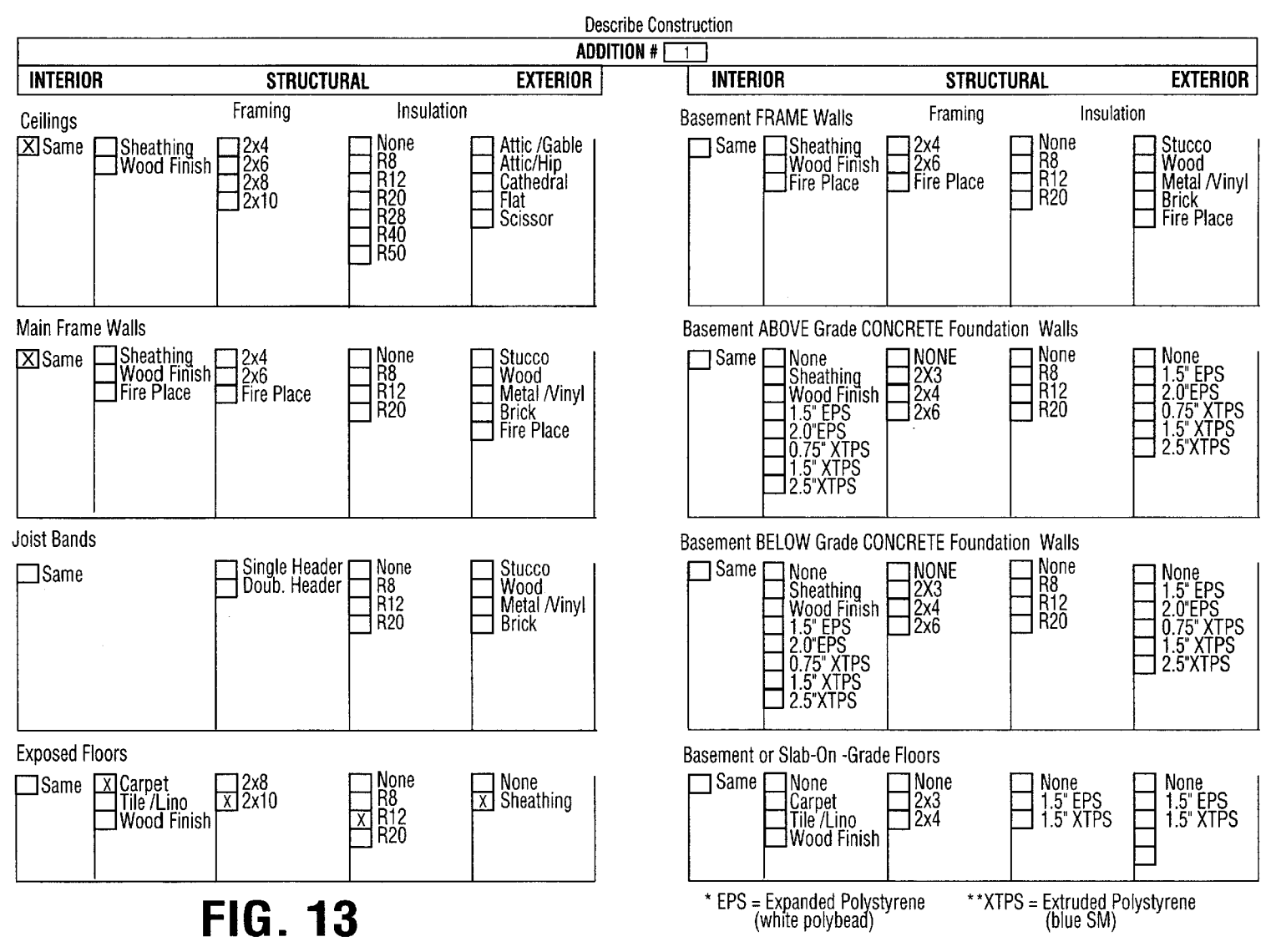

At step 70, the location of the ground with respect to the addition is described. The construction details of the addition are described at step 72, as shown in the worksheet of FIG. 13. Similar measurements for the addition are made as were described for the core in the paragraph immediately preceding. If at step 74 the composite structure sufficiently describes the heated envelope, then the windows are pasted at step 76 and the doors are pasted at step 78. The worksheets for steps 76 and 78 are shown respectively in FIGS. 14 and 15. In FIG. 14, the typical window size is recorded, along with the number of such windows in each zone, the frame material of the windows, their glazing type, and their style. The orientation of the front window is also recorded in FIG. 14. In FIG. 15, the number of standard doors and their location is recorded together with their construction.

With the foregoing information, it is a simple matter to use a computer-based application, such as Home Energy Planning Tool Kit (HEP) available from Sheltair Scientific Ltd. of Vancouver, British Columbia, Canada, that uses the method of the invention to compute areas of surfaces and volumes of surfaces, and that applies these results in an energy simulation to compute heat losses and gains of and through various parts of a building structure. FIG. 16 shows a sample of areas of surfaces and volumes of spaces obtained using the method of the invention.

Figure 17:
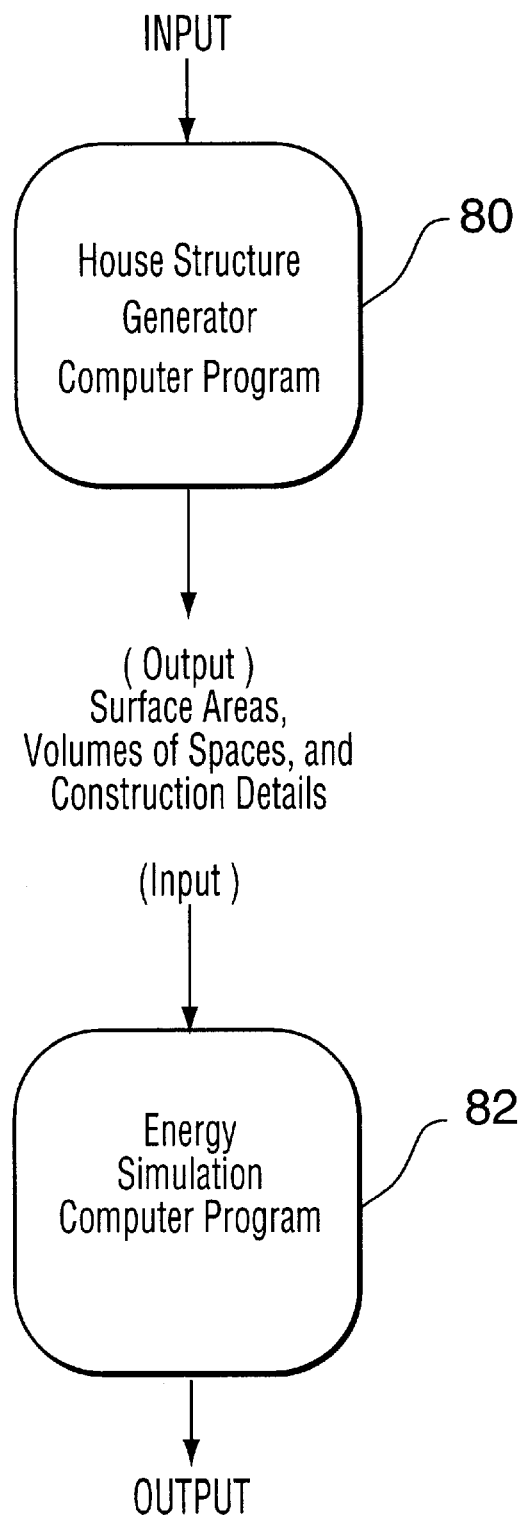
FIG. 17 is a flow diagram showing the sequence for combining the two types of computer programs that can be used to first generate the results of FIG. 16 and then to use these results as input to an energy simulation that determines the heat losses and gains of and through various components of a building structure.

Components of a computer-based application that employs the method of this invention together with an energy simulation program to compute heat losses and gains of and through various parts of a building structure is shown in FIG. 17. In this case, collected structural information is entered into the House Structure Generator 80, which incorporates the method of this invention. Collected structural information can include: the selection of specific core and addition structural information templates (e.g. a two level box-shape core structure and a one level box-shape addition structure); orientation information for the core structure and each addition; width and depth dimensions for the core and each addition; adjusted default dimensions for the core and each addition; and location details for each addition. Collected structural information can further include: details concerning the location of the ground with respect to the composite building structure; dimension and location information for windows and doors; and construction details for ceilings, walls, floors, windows, and doors.

The House Structure Generator 80 is a computer software program that incorporates predefined core and addition structural information that is organized by the structural information templates. The House Structure Generator 80 uses the predefined structural information templates to process collected structural information for the purpose of calculating areas of surfaces and volumes of spaces that are required as input by the energy simulation program 82. Also, the House Structure Generator 80 uses the predefined structural information templates to process collected information for the purpose of assigning construction-related attributes (e.g., measure of resistance to heat flow) to each of the discrete surface areas required as input by the energy simulation program 82. The House Structure Generator 80 produces the type of output results set forth in FIG. 16.

Obviously, the House Structure Generator program 80 can easily be modified to generate the type of input information required for other applications such as input for a CAD program or for a cost estimating program.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

We claim:

1. A method of describing a building structure and producing data indicative of areas of surfaces and volumes of spaces of said building structure, comprising:

a) selecting a core structural information template from a plurality of possible core structural information templates wherein said core structural information template includes a member of the group selected from a predefined geometric form, a predefined orientation for said geometric form, labels assigned to one or more discrete surfaces, vectors and vertices of said geometric form, or a combination thereof, and wherein said core structural information template facilitates the input of data to generate a core structure representative of the geometric form, dimensions and orientation of all or part of said building structure;

b) specifying an orientation of said core structure;

c) specifying dimensions of said core structure;

d) selecting one or more addition structural information templates from a plurality of possible addition structural information templates representing addition structures wherein said addition structures are additions to said core structure or to other addition structures, wherein said addition structural information templates include a member of the group selected from a predefined geometric form, a predefined orientation for said geometric form, labels assigned to one or more discrete surfaces, vectors and vertices of said geometric form, predefined constraints on the type of structures to which said addition structures may be added, predefined constraints on the locations of said addition structures, a predefined method for specifying the location of said addition structures, or a combination thereof, and wherein said addition structural information templates facilitate the input of data to generate one of said addition structures representative of the geometric form, dimensions, orientation and relative location of some part of said building structure;

e) specifying an orientation of each of said addition structures;

f) specifying dimensions of each of said addition structures;

g) specifying a location of each of said addition structures relative to said core structure or relative to others of said addition structures; and h) calculating data indicative of areas of surfaces and volumes of spaces of said building structure using structural information generated by steps a) to g) inclusive.

2. A method according to claim 1, including describing: a location of ground with respect to a building structure; construction details of said building structure; reference window dimensions for each of the front, back, left and right sides of said building structure and the number of windows on each level of said building structure that provide an equivalent total window area for that level of said building structure; orientation of said windows; construction details of said windows; the number of doors of standard size on each of said levels of said building structure, and the construction type of said doors.

3. A method according to claim 1, wherein the core structure has rectangular geometry.

4. A method according to claim 2, including using said data indicative of areas of surfaces and volumes of spaces, said ground location, and window and door information in applying an energy audit on said building structure that includes an energy simulation to determine heat losses and gains of and through various components of said building structure.

5. The method of claim 1, wherein one of said core and addition structural information templates describes a plurality of discrete forms.

6. The method of claim 1, wherein one or more of said core and addition structural information templates includes preassignment of unique labels to discrete surfaces, vectors, and vertices of a structural element or to groupings of surfaces, vectors, and vertices of structural elements.

7. The method of claim 1, wherein one or more of said addition structural information templates facilitates the location of an associated addition element as being on the inside or inside and outside of an exterior surface of another element.

8. The method of claim 1, wherein one or more of said core and addition structural information templates distinguish between defaulted and nondefaulted dimension parameters, and said structural information templates facilitate a reviewing and adjusting of said default dimension parameters.

9. A process for conducting an energy audit on a building structure:

a) determining the heated envelope of said building structure;

b) selecting a core structural information template from a plurality of possible core structural information templates wherein said core structural information template includes a member of the group selected from a predefined geometric form, a predefined orientation for said geometric form, labels assigned to one or more discrete surfaces, vectors and vertices of said geometric form, or a combination thereof, and wherein said core structural information template facilitates the input of data to generate a core structure representative of the geometric form, dimensions and orientation of all or part of said building structure;

c) specifying an orientation of said core structure;

d) specifying dimensions of said core structure;

e) specifying the location of ground with respect to said core structure and specifying construction details of said core structure;

f) selecting one or more addition structural information templates from a plurality of possible addition structural information templates if said building structure has a composite structure, wherein said addition structures are addition to said core structure or to other addition structures, wherein said addition structural information templates include a member of the group selected from a predefined geometric form a predefined orientation for said geometric form, labels assigned to one or more discrete surfaces, vectors and vertices of said geometric Form, predefined constraints on the type of structures to which said addition structures may be added, predefined constraints on the locations of said addition structures, a predefined method for specifying the location of said addition structures, or a combination thereof, and wherein said addition structural information templates facilitate the input of data to generate one of said addition structures representative of the geometric form, dimensions, orientation and relative location of some part of said building structure;

g) specifying an orientation of each of said addition structures;

h) specifying dimensions of each of said addition structures;

i) specifying a location of each of said addition structures relative to said core structure or relative to others of said addition structures;

j) specifying the location of the ground with respect to said addition structures and specifying construction details of each of said addition structures;

k) calculating data indicative of areas of surfaces and volumes of spaces of said building structure using structural information generated by steps a) to j) inclusive; and l) applying structural information generated by steps a) to j) inclusive and said data indicative of areas of surfaces and volumes of spaces to an energy simulation program to determine heat losses and gains of and through various components of said building structure.

* * * * *